(12) United States Patent
Kim et al.

(10) Patent No.: US 10,748,936 B2
(45) Date of Patent: Aug. 18, 2020

(54) THIN FILM TRANSISTOR ARRAY PANEL AND MANUFACTURING METHOD THEREOF

(71) Applicant: SAMSUNG DISPLAY CO., LTD., Yongin-si, Gyeonggi-Do (KR)

(72) Inventors: Sung Ho Kim, Suwon-si (KR); Dong Won Kim, Seoul (KR); Jong Moo Huh, Hwaseong-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 16/232,244

(22) Filed: Dec. 26, 2018

(65) Prior Publication Data

US 2019/0148411 A1 May 16, 2019

Related U.S. Application Data

(62) Division of application No. 15/434,150, filed on Feb. 16, 2017, now Pat. No. 10,217,767.

(30) Foreign Application Priority Data

May 3, 2016 (KR) .......................... 10-2016-0054802

(51) Int. Cl.
| | |
|---|---|
| *H01L 27/12* | (2006.01) |
| *H01L 27/32* | (2006.01) |
| *H01L 29/786* | (2006.01) |

(52) U.S. Cl.
CPC ...... *H01L 27/1214* (2013.01); *H01L 27/1218* (2013.01); *H01L 27/1225* (2013.01);
(Continued)

(58) Field of Classification Search
CPC .............. H01L 27/127; H01L 27/1288; H01L 27/3272; H01L 29/78633; H01L 27/1214;
(Continued)

(56) References Cited

U.S. PATENT DOCUMENTS

| | | |
|---|---|---|
| 6,262,436 B1 | 7/2001 | Nakata |
| 2013/0009148 A1 | 1/2013 | Yamazaki |

(Continued)

FOREIGN PATENT DOCUMENTS

| | | |
|---|---|---|
| JP | 11-145478 | 5/1999 |
| KR | 10-2003-0029615 | 4/2003 |

(Continued)

*Primary Examiner* — Thanhha S Pham
(74) *Attorney, Agent, or Firm* — F. Chau & Associates, LLC

(57) ABSTRACT

A thin film transistor array panel includes a substrate and a thin film transistor disposed on a surface of the substrate. The thin film transistor includes a semiconductor, a source electrode, and a drain electrode that are disposed on a same layer as one another. The semiconductor is between the source electrode and the drain electrode. The thin film transistor array panel further includes a buffer layer disposed between the semiconductor and the substrate and including an inorganic insulating material. The first edge of the buffer layer is substantially parallel to an adjacent edge of the semiconductor, a second edge of the buffer layer is substantially parallel to an adjacent edge of the source electrode, and a third edge of the buffer layer is substantially parallel to an adjacent edge of the drain electrode.

11 Claims, 13 Drawing Sheets

(52) U.S. Cl.
CPC ...... *H01L 27/1248* (2013.01); *H01L 27/3241* (2013.01); *H01L 27/3244* (2013.01); *H01L 27/3248* (2013.01); *H01L 27/3262* (2013.01); *H01L 27/3272* (2013.01); *H01L 27/3274* (2013.01); *H01L 29/7869* (2013.01); *H01L 29/78633* (2013.01); *H01L 29/78648* (2013.01)

(58) Field of Classification Search
CPC ............ H01L 27/3274; H01L 27/3244; H01L 27/3241; H01L 29/78693
See application file for complete search history.

(56) References Cited

U.S. PATENT DOCUMENTS

| | | | |
|---|---|---|---|
| 2014/0118656 A1 | 5/2014 | Jang et al. | |
| 2014/0167040 A1* | 6/2014 | Lee | H01L 29/66969 257/43 |
| 2015/0187854 A1* | 7/2015 | Beak | H01L 27/3262 257/40 |
| 2015/0187959 A1 | 7/2015 | Yoon | |
| 2017/0186831 A1* | 6/2017 | Nam | H01L 27/3272 |
| 2017/0323904 A1 | 11/2017 | Kim et al. | |

FOREIGN PATENT DOCUMENTS

| | | |
|---|---|---|
| KR | 10-2010-0132308 | 12/2010 |
| KR | 10-2013-0058511 | 6/2013 |
| KR | 10-2015-0002279 | 1/2015 |
| KR | 10-2015-0027361 | 3/2015 |

* cited by examiner

THIN FILM TRANSISTOR ARRAY PANEL AND MANUFACTURING METHOD THEREOF

CROSS-REFERENCE TO RELATED APPLICATIONS

This application is a divisional of U.S. patent application Ser. No. 15/434,150 filed on Feb. 16, 2017, which claims priority under 35 U.S.C. § 119 to Korean Patent Application No. 10-2016-0054802 filed on May 3, 2016 in the Korean Intellectual Property Office, the disclosures of which are incorporated by reference herein in their entireties.

TECHNICAL FIELD

One or more exemplary embodiments of the present inventive concept relate to a display device, and more particularly, to a thin film transistor array panel and a manufacturing method thereof.

DISCUSSION OF THE RELATED ART

A thin film transistor included in various electronic devices such as a display device includes a gate electrode electrically connected to a gate line transmitting a scanning signal, a source electrode electrically connected to a data line transmitting a signal to be applied to a pixel electrode, a drain electrode connected to the source electrode via a semiconductor channel.

The material used for the semiconductor channel affects the behavior and performance of the thin film transistor. A semiconductor material may be silicon (Si), which may be an amorphous silicon or polysilicon, depending on a crystallization type of the semiconductor. Amorphous silicon has a simple manufacturing process but has low charge mobility and may not be suitable for high performance operations. On the other hand, polysilicon has high charge mobility, but crystallization is required. An oxide semiconductor has higher electron mobility than an amorphous silicon and a lower manufacturing cost than a polysilicon.

SUMMARY

According to an exemplary embodiment of the present inventive concept, a thin film transistor array panel includes a substrate and a thin film transistor disposed on a surface of the substrate. The thin film transistor includes a semiconductor, a source electrode, and a drain electrode that are disposed on a same layer as one another. The semiconductor is between the source electrode and the drain electrode. The thin film transistor array panel further includes a buffer layer disposed between the semiconductor and the substrate and including an inorganic insulating material. The first edge of the buffer layer is substantially parallel to an adjacent edge of the semiconductor, a second edge of the buffer layer is substantially parallel to an adjacent edge of the source electrode, and a third edge of the buffer layer is substantially parallel to an adjacent edge of the drain electrode.

In an exemplary embodiment of the present inventive concept, the thin film transistor further includes a gate electrode overlapping the semiconductor and a gate insulator disposed between the gate electrode and the semiconductor, and a boundary between the semiconductor and the source electrode or a boundary between the semiconductor and the drain electrode is substantially aligned with an adjacent side surface of the gate insulator extending in a direction substantially perpendicular to a surface of the substrate.

In an exemplary embodiment of the present inventive concept, the thin film transistor array panel further includes a light blocking film disposed between the buffer layer and the substrate. The light blocking film includes a part overlapping the buffer layer.

In an exemplary embodiment of the present inventive concept, the thin film transistor array panel further includes an interlayer insulating layer disposed on the thin film transistor and including an insulating material. The interlayer insulating layer includes a first contact hole on the drain electrode, and a second contact hole on the light blocking film.

In an exemplary embodiment of the present inventive concept, the light blocking film has conductivity.

In an exemplary embodiment of the present inventive concept, a depth of the first contact hole and a depth of the second contact hole are substantially equal to each other.

In an exemplary embodiment of the present inventive concept, the thin film transistor array panel further includes a first connection part disposed on the interlayer insulating layer and electrically connected to the drain electrode through the first contact hole. The thin film transistor array panel additionally includes a second connection part disposed on the interlayer insulating layer and electrically connected to the light blocking film through the second contact hole.

In an exemplary embodiment of the present inventive concept, the first connection part and the second connection part are connected to each other.

In an exemplary embodiment of the present inventive concept, the thin film transistor array panel further includes a passivation layer disposed on the first and second connection parts. The passivation layer includes a third contact hole on one of the first connection part and the second connection part. The thin film transistor array panel further includes a pixel electrode electrically connected to one of the first connection part and the second connection part through the third contact hole.

In an exemplary embodiment of the present inventive concept, the thin film transistor array panel further includes a gate conductor disposed at a same layer as the gate electrode and including substantially a same material as the gate electrode. The interlayer insulating layer includes a fourth contact hole on the gate conductor, and a depth of the fourth contact hole is substantially the same as the depth of the first contact hole or the second contact hole.

According to an exemplary embodiment of the present inventive concept, a method for manufacturing a thin film transistor array panel includes forming a buffer layer by depositing a first insulating material on a substrate and forming a semiconductor layer by depositing and patterning an oxide semiconductor material on the buffer layer. The method for manufacturing a thin film transistor array panel further includes forming a gate insulating layer by depositing a second insulating material on the substrate and forming a gate conductive layer by depositing a conductive material on the gate insulating layer. The method for manufacturing a thin film transistor array panel further includes forming a photosensitive film pattern on the gate conductive layer by coating the gate conductive layer with a photoresist and patterning the photoresist through an exposure process using a mask. The method for manufacturing a thin film transistor array panel additionally includes etching the gate conductive layer by using the photosensitive film pattern as a mask to form a gate electrode. The method for manufacturing a thin film transistor array panel further includes etching the gate insulating layer by using the photosensitive film pattern as a mask to form a gate insulator, and etching the buffer layer by using the semiconductor layer as a mask.

In an exemplary embodiment of the present inventive concept, etching the buffer layer includes removing all sections of the buffer layer that are not covered by the semiconductor layer.

In an exemplary embodiment of the present inventive concept, the method for manufacturing a thin film transistor array panel further includes forming a light blocking film on the substrate before forming the buffer layer. A part of the light blocking film is exposed during the step of etching the buffer layer.

In an exemplary embodiment of the present inventive concept, the method for manufacturing a thin film transistor array panel further includes forming a source electrode and a drain electrode from part of the semiconductor layer.

In an exemplary embodiment of the present inventive concept, the method for manufacturing a thin film transistor array panel further includes forming an interlayer insulating layer by depositing a third insulating material on the substrate, forming a first contact hole exposing the drain electrode by patterning the interlayer insulating layer through a photolithography process using one photomask, and forming a second contact hole exposing the light blocking film by patterning the interlayer insulating layer through the photolithography process using the one photomask.

In an exemplary embodiment of the present inventive concept, the method for manufacturing a thin film transistor array panel further includes forming a first connection part electrically connected to the drain electrode through the first contact hole and by depositing and patterning a conductive material on the substrate after patterning the interlayer insulating layer. The method for manufacturing a thin film transistor array panel further includes forming a second connection part electrically connected to the light blocking film through the second contact hole by depositing and patterning the conductive material on the substrate after patterning the interlayer insulating layer. The first connection part and the second connection part are connected to each other.

In an exemplary embodiment of the present inventive concept, the method for manufacturing a thin film transistor array panel further includes forming a passivation layer on the substrate, forming a third contact hole exposing one of the first connection part and the second connection part by patterning the passivation layer, and forming a pixel electrode on the passivation layer. The pixel electrode is electrically connected to one of the first connection part and the second connection part through the third contact hole.

In an exemplary embodiment of the present inventive concept, the interlayer insulating layer includes at least one among a silicon oxide (SiOx), a silicon nitride (SiNx), and a silicon oxynitride (SiON).

In an exemplary embodiment of the present inventive concept, the step of forming the source electrode and the drain electrode is partially performed in at least one of the step of etching the gate insulating layer and the step of forming the interlayer insulating layer.

In an exemplary embodiment of the present inventive concept, the step of forming the source electrode and the drain electrode includes performing a plasma process on the semiconductor layer.

According to an exemplary embodiment of the present inventive concept, a thin film transistor array panel includes a substrate and a thin film transistor disposed on the substrate and including a first layer. The first layer includes a semiconductor, a source electrode, and a drain electrode. The semiconductor is between the source electrode and the drain electrode. The thin film transistor array panel further includes a buffer layer disposed between the first layer and the substrate and including an inorganic insulating material. A surface area of a bottom surface of the first layer is greater than or equal to a surface area of a top surface of the buffer layer.

In an exemplary embodiment of the present inventive concept, the surface area of the bottom surface of the first layer is greater than or equal to a surface area of a bottom surface of the buffer layer.

In an exemplary embodiment of the present inventive concept, the thin film transistor further includes a gate insulator disposed on the semiconductor, and a boundary between the semiconductor and the source electrode and a boundary between the semiconductor and the drain electrode are each substantially aligned with a side surface of the gate insulator extending in a direction perpendicular to the surface of the substrate.

In an exemplary embodiment of the present inventive concept, the thin film transistor array panel further includes a light blocking film disposed between the buffer layer and the substrate. The light blocking film overlaps the buffer layer.

BRIEF DESCRIPTION OF THE DRAWINGS

The above and other features of the inventive concept will become more apparent by describing in detail exemplary embodiments thereof, with reference to the accompanying drawing, in which.

DETAILED DESCRIPTION OF THE EMBODIMENTS

Figure 1:
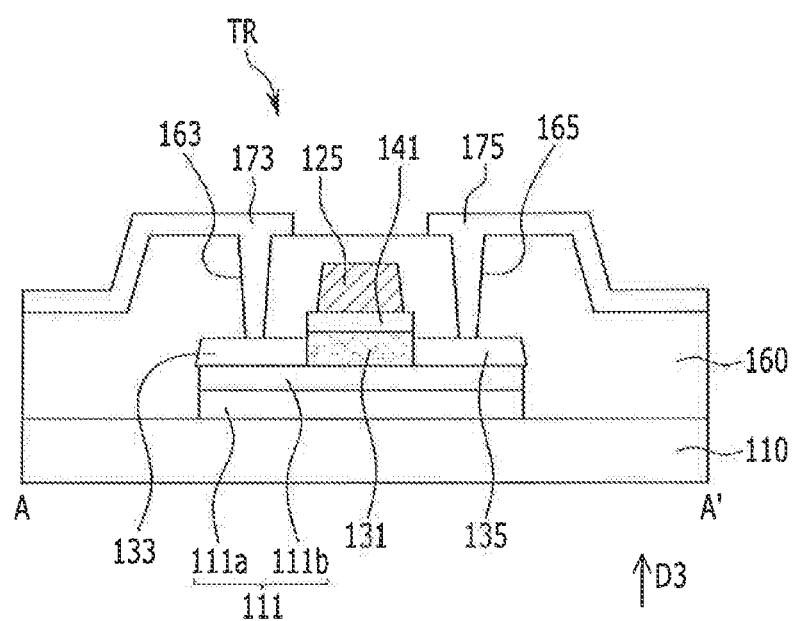
FIG. 1 is a cross-sectional view of a thin film transistor array panel according to an exemplary embodiment of the present inventive concept.

Exemplary embodiments of the present inventive concept will be described more fully hereinafter with reference to the accompanying drawings.

In the drawings, the thickness of layers, films, panels, regions, etc., may be reduced or enlarged for clarity. Reference numerals that are similar or identical may designate similar or identical elements or features throughout the specification and drawings. It will be understood that when an element such as a layer, film, region, or substrate is referred to as being "on" another element, it may be directly on the other element or intervening elements may also be present. In contrast, when an element is referred to as being "directly on" another element, there are no intervening elements present.

Throughout this specification and the claims that follow, when it is described that an element is "coupled" to another element, the element may be "directly coupled" to the other element or "electrically coupled" to the other element through a third element.

Now, a structure of a thin film transistor array panel and a method of manufacturing a thin film transistor array panel according to an exemplary embodiment of the present inventive concept will be described in detail with reference to accompanying drawings.

Figure 2:
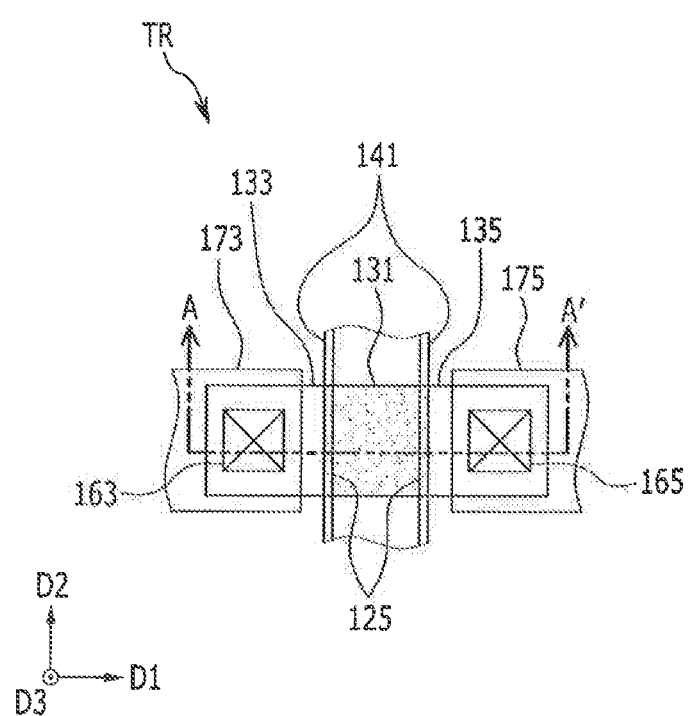
FIG. 2 is a top plan view of the thin film transistor array panel shown in FIG. 1.

The thin film transistor array panel according to an exemplary embodiment of the present inventive concept will be described with reference to FIG. 1 and FIG. 2. FIG. 1 is the cross-sectional view of the thin film transistor array panel according to an exemplary embodiment of the present inventive concept. FIG. 2 is a top plan view of the thin film transistor array panel shown in FIG. 1; however, the plan view of the structure of the thin film transistor array panel shown in FIG. 1 is not limited to the plan view structure of FIG. 2.

Referring to FIG. 1, the thin film transistor array panel according to an exemplary embodiment of the present inventive concept includes a substrate 110 and a thin film transistors TR positioned on the substrate 110. However, it is understood that a plurality of thin film transistors TR may be positioned on the substrate 110.

Referring to FIG. 1 and FIG. 2, a first direction D1 and a second direction D2 are parallel to a surface shown when viewing the surface in a direction perpendicular to a surface of the substrate 110 (e.g., a plan view of the substrate 110). In addition, the first and second directions D1 and D2 are perpendicular to each other. Further, a third direction D3 is perpendicular to the first and second directions D1 and D2 and is substantially perpendicular to the surface of the substrate 110. The third direction D3 may be represented in a cross-sectional structure and is referred to as a cross-sectional direction. A structure shown by observing the surface parallel to the first direction D1 and the second direction D2 in a direction substantially perpendicular to the surface is referred to as a plan structure. In the cross-sectional structure, if a constituent element is positioned on any other constituent element, it means that two constituent elements are arranged in the third direction D3, and other constituent elements may be positioned between the two constituent elements.

The substrate 110 may include an insulating material such as plastic, glass, etc.

The thin film transistor TR includes a gate electrode 125, and a semiconductor 131, a source electrode 133, a drain electrode 135, and a gate insulator 141 disposed between the semiconductor 131 and the gate electrode 125.

The gate electrode 125 is electrically connected to a gate line, and may receive a gate signal including a gate-on voltage Von and a gate-off voltage Voff. The gate electrode 125 may be disposed on the same layer as the gate line, and may include substantially the same material as the gate line.

The gate electrode 125 may be made of, for example, an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), titanium (Ti), etc. However, the gate electrode 125 may include a multi-layer structure including at least two conductive layers having different physical properties from one another.

Referring to FIG. 1, the gate insulator 141 is disposed between the semiconductor 131 and the gate electrode 125.

The gate insulator 141 may include an insulating material such as a silicon oxide (SiOx), a silicon nitride (SiNx), or a silicon oxynitride (SiON).

The gate insulator 141 may be a single layer or a multi-layer structure, which may be a dual layer or more. When the gate insulator 141 is the single layer, the gate insulator 141 may include the insulating material such as a silicon oxide (SiOx), a silicon nitride (SiNx), a silicon oxynitride (SiON), aluminum oxide ($Al_2O_3$), hafnium oxide ($HfO_2$), and yttrium oxide ($Y_2O_3$). When the gate insulator 141 is the multilayer structure, a lowest layer of the multilayer facing the semiconductor 131 may include an insulating oxide such as a silicon oxide (SiOx), aluminum oxide ($Al_2O_3$), hafnium oxide ($HfO_3$), and yttrium oxide ($Y_2O_3$), thereby improving an interface characteristic of the semiconductor 131 and preventing an impurity from penetrating the semiconductor 131. In addition to the lowest layer, at least one layer of the multilayer structure that is positioned on the lowest layer of the multilayer structure may include various insulating materials such as a silicon nitride (SiNx) and a silicon oxide (SiOx).

Referring to FIG. 1 and FIG. 2, a plane shape of the gate insulator 141 is substantially the same as the plane shape of the gate electrode 125. Here, the plane shape means the plane shape of a surface of corresponding constituent element(s). In addition, an edge may be where two surfaces (e.g. a side surface and an upper surface) connect to each other and form an angle greater than zero at the connection (e.g. a vertex). For example, an edge of the gate insulator 141 may be formed at a connection between its upper surface, which is substantially parallel to an upper surface of the substrate 110, and its side surface, which extends in a direction substantially perpendicular to the upper surface of the substrate 110. For example, as shown in FIG. 2, an edge of the gate insulator 141 extending in the second direction D2, particularly, an edge of the upper surface, is substantially parallel to an adjacent edge of the gate electrode 125 extending in the second direction D2, particularly, an edge of the lower surface. That two edges are substantially parallel to one another means that two edges agree, are aligned with one another, overlap one another, or are parallel to one another within a predetermined distance even if they do not precisely match. Further, FIG. 1 and FIG. 2 show an example in which the edge of the gate insulator 141 is positioned more at the outer side than the adjacent edge of the lower surface of the gate electrode 125 and is substantially parallel to the adjacent edge of the lower surface of the gate electrode 125 within the predetermined distance. For example, the gate insulator 141 may have a larger width than a width of the gate electrode 125. This may be a result of the gate electrode 125 and the gate insulator 141 being formed by using the same photomask in a manufacturing process of the thin film transistor array panel.

The semiconductor 131 overlaps the gate electrode 125, and the gate insulator 141 is disposed between the semiconductor 131 and the gate electrode 125. Further, a channel of the thin film transistor TR is included in the semiconductor 131.

Referring to FIG. 1 and FIG. 2, the source electrode 133 and the drain electrode 135 are positioned on opposite sides of the semiconductor 131 and are separated from one another by the semiconductor 131. The source electrode 133 and the drain electrode 135 are positioned at substantially the same layer as the semiconductor 131, and are each directly connected to the semiconductor 131.

The source electrode 133, the drain electrode 135, and the semiconductor 131 include substantially the same material (e.g., the same oxide). The oxide included in the semiconductor 131, the source electrode 133, and the drain electrode 135 may include a metal oxide such as one of zinc (Zn), indium (In), gallium (Ga), tin (Sn), and titanium (Ti), or a combination of the metals such as zinc (Zn), indium (In), gallium (Ga), tin (Sn), titanium (Ti), and the oxide thereof. For example, the oxide included in the semiconductor 131, the source electrode 133, and the drain electrode 135 may include at least one among zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

A carrier concentration of the source electrode 133 and the drain electrode 135 may be different from the carrier concentration of the semiconductor 131. For example, when the carrier concentration of the semiconductor 131 is less than $10^{18}/cm^3$, the carrier concentration of the source electrode 133 and the drain electrode 135 may be greater than or equal to $10^{18}/cm^3$. A gradient region exists where the carrier concentration gradually changes in a boundary between the source electrode 133 and the semiconductor 131 and a boundary between the drain electrode 135 and the semiconductor 131.

The source electrode 133 and the drain electrode 135 may include a material of an oxide semiconductor included in the semiconductor 131 that includes the channel of the thin film transistor TR. The source electrode 133 and the drain electrode 135 may further include the oxide semiconductor included in the semiconductor 131 along with the material of the oxide semiconductor. For example, the source electrode 133 and the drain electrode 135 may further include at least one among fluorine (F), hydrogen (H), and sulfur (S) in addition to with the oxide semiconductor included in the semiconductor 131. The concentration of at least one among fluorine (F), hydrogen (H), and sulfur (S) included in the source electrode 133 and the drain electrode 135 may have a carrier concentration greater than or equal to $10^{15}/cm^3$. In the boundary between the source electrode 133 and the semiconductor 131 and the boundary between the drain electrode 135 and the semiconductor 131, the gradient region, which is where the concentration of at least one among fluorine (F), hydrogen (H), and sulfur (S) gradually changes, may exist.

The source electrode 133 and the drain electrode 135 may be formed by performing plasma processing on the oxide semiconductor included in the semiconductor 131. For example, the oxide semiconductor may be doped with a gas including at least one among fluorine (F), hydrogen (H), and sulfur (S) in a chamber to form the source electrode 133 and the drain electrode 135 according to an exemplary embodiment of the present inventive concept.

Accordingly, according to an exemplary embodiment of the present inventive concept, the approximate plane shape of the semiconductor 131 is substantially the same as the plane shape of the gate insulator 141. For example, with reference to FIG. 2, an edge of the semiconductor 131 extending in a second direction D2, particularly an edge of the upper surface, may be substantially parallel to an adjacent edge of the gate insulator 141 extending in the second direction D2, particularly an adjacent edge of the lower surface. For example, the edge of the semiconductor 131 extending in the second direction D2 may be aligned with the adjacent edge of the gate insulator 141 extending in the second direction D2 such that the edge of the semiconductor 131 may be covered by the adjacent edge of the gate insulator 141; however, exemplary embodiments of the present inventive concept are not limited thereto. In other words, with reference to FIG. 2, the boundary, between the semiconductor 131 and the source electrode 133, extending in the second direction D2 or the boundary, between the semiconductor 131 and the drain electrode 135, extending in the second direction D2 may be substantially aligned with an adjacent edge of the gate insulator 141 extending in the second direction D2, particularly an adjacent edge of the lower surface of the gate insulator 141. Alternatively, the boundary between the semiconductor 131 and the source electrode 133 or the boundary between the semiconductor 131 and the drain electrode 135 may be positioned more towards an inside or an outside of the adjacent edge of the gate insulator 141. In addition, the two boundaries mentioned above may each be substantially parallel to an adjacent edge of the gate insulator 141.

The gate insulator 141 covers most of the semiconductor 131. For example, the gate insulator 141 may cover the entire upper surface of the semiconductor 131.

According to an exemplary embodiment of the present inventive concept, the source electrode 133 and the drain electrode 135 may partially overlap or not overlap the gate electrode 125 in the third direction D3. Accordingly, a parasitic capacitance between the gate electrode 125, and the source electrode 133 or the drain electrode 135, may be significantly reduced. As a result, kickback voltage, signal delay, and distortion may be reduced.

An interlayer insulating layer 160 may be disposed on the thin film transistor TR. The interlayer insulating layer 160 may include the inorganic insulating material such as a silicon oxide (SiOx), a silicon nitride (SiNx), a silicon oxynitride (SiON), and silicon oxyfluoride (SiOF).

The interlayer insulating layer 160 may be a single layer or a multilayer structure, which may be a dual layer or more that includes different materials. When the interlayer insulating layer 160 is the single layer structure, the interlayer insulating layer 160 may include the inorganic insulating material such as a silicon oxide (SiOx), a silicon nitride (SiNx), a silicon oxynitride (SiON), and silicon oxyfluoride (SiOF), and particularly, may include at least one of a silicon nitride (SiNx) and a silicon oxynitride (SiON) for reducing the resistance of the source electrode 133 and the drain electrode 135 by inflowing hydrogen (H) in the source electrode 133 and the drain electrode 135. When the interlayer insulating layer 160 is the multilayer structure, the lowest layer of the multilayer structure may include at least one of a silicon nitride (SiNx) and a silicon oxynitride (SiON) for reducing the resistance of the source electrode 133 and the drain electrode 135 by inflowing hydrogen (H) into the source electrode 133 and the drain electrode 135. In addition, a middle layer and an upper layer of the multilayer structure may include a silicon oxide (SiOx) that may be disposed on the lowest layer of the multiplayer structure. When the interlayer insulating layer 160 is the multilayer structure, another layer including material such as a silicon nitride (SiNx) or a silicon oxynitride (SiON) may be disposed on the middle layer including a silicon oxide (SiOx).

The source electrode 133 and the drain electrode 135 may be formed to be conductive through a separate plasma processing after depositing the oxide semiconductor material on the substrate 110; however, a component such as hydrogen included in a gas (e.g., silane ($SiH_4$) and ammonia (NH$_3$) used in a layer formation process of the interlayer insulating layer 160) may be doped into the semiconductor layer, thereby reducing a resistance. Alternatively, the component such as hydrogen included in the interlayer insulating layer 160 may be diffused into the semiconductor layer after forming the interlayer insulating layer 160, thereby reducing the resistance. Also, the source electrode 133 and the drain electrode 135 may be doped with the component of an etch gas used in a patterning process of the above-described gate insulator 141.

The interlayer insulating layer 160 may include a contact hole 163 on the source electrode 133 and a contact hole 165 on the drain electrode 135. For example, the contact hole 163 may penetrate the interlayer insulating layer 160 and may expose a portion of the source electrode 133, and the contact hole 165 may penetrate the interlayer insulating layer 160 and may expose a portion of the drain electrode 135. At least one of the contact holes 163 and 165 may be omitted depending on a kind of the thin film transistor TR.

A data conductor including a first connection part 173 and a second connection part 175 is disposed on the interlayer insulating layer 160. The first connection part 173 is electrically connected to the source electrode 133 of the thin film transistor TR through the contact hole 163 of the interlayer insulating layer 160, and the second connection part 175 is electrically connected to the drain electrode 135 of the thin film transistor TR through the contact hole 165 of the interlayer insulating layer 160. At least one of the first connection part 173 and the second connection part 175 of the thin film transistor TR may be omitted depending on a kind of the thin film transistor TR.

A buffer layer 111 is disposed between the substrate 110 and the semiconductor 131. The buffer layer 111 may prevent impurities from flowing or permeating into the semiconductor 131 from the substrate 110, thereby protecting the semiconductor 131 and improving the characteristics of the semiconductor 131.

The buffer layer 111 may include the inorganic insulating material such as a silicon oxide (SiOx), a silicon nitride (SiNx), aluminum oxide (Al$_2$O$_3$), hafnium oxide (HfO$_3$), and/or yttrium oxide (Y$_2$O$_3$).

The buffer layer 111 may be the single layer or the multilayer structure, which may be a dual layer or more. For example, as shown in FIG. 1, when the buffer layer 111 is the dual layer, a lower layer 111a may include a silicon nitride (SiNx) and an upper layer 111b may include a silicon oxide (SiOx).

Referring to FIG. 1, the plane shape of the buffer layer 111 is substantially the same as the entire plane shape of the source electrode 133, the semiconductor 131, and the drain electrode 135 that are connected to one another. An edge of the buffer layer 111 extending in the first direction D1, particularly an edge of the upper surface of the buffer layer 111, may be substantially aligned with an adjacent edge of the source electrode 133, the semiconductor 131, and the drain electrode 135 as a whole body extending in the first direction D1, particularly an adjacent edge of the lower surface. Further, FIG. 1 shows an exemplary embodiment of the present inventive concept in which the edge of the buffer layer 111 extending in the first direction D1 is positioned inside the adjacent edge of the entire lower surface of the source electrode 133, the semiconductor 131, and the drain electrode 135 extending in the first direction D1, and they are approximately parallel to each other within the predetermined distance. Alternatively, the edge of the upper surface of the buffer layer 111 extending in the first direction D1 may be substantially aligned and matched with the adjacent edge of the entire lower surface of the source electrode 133, the semiconductor 131, and the drain electrode 135 extending in the first direction D1, or the edge of the upper surface of the buffer layer 111 may be positioned outside thereof. In other words, the buffer layer 111 may be disposed under the source electrode 133, the semiconductor 131, and the drain electrode 135 of the thin film transistor TR. In addition, the upper surface of the substrate 110 that does not overlap the source electrode 133, the semiconductor 131, and the drain electrode 135 in the third direction D3 may directly contact the interlayer insulating layer 160.

In an exemplary embodiment of the present inventive concept, the buffer layer 1 may be disposed below the source electrode 133, the semiconductor 131, and the drain electrode 135. A first side surface of the buffer layer 111 that is substantially perpendicular to the substrate 110 along the second direction D2 may be substantially aligned with an adjacent side surface of the source electrode 133 along the second direction D2. In addition, a second side surface of the buffer layer 111 that is substantially perpendicular to the substrate 110 along the second direction D2 may be substantially aligned with an adjacent side surface of the drain electrode 135 along the second direction D2. However, exemplary embodiments of the present inventive concept are not limited thereto.

This thin film transistor array panel is the result of the buffer layer 111 being etched by using the entire source electrode 133, semiconductor 131, and drain electrode 135 as an etching mask in the manufacturing process of the thin film transistor array panel.

As described, according to an exemplary embodiment of the present inventive concept, the buffer layer 111 disposed under the plurality of thin film transistors TR disposed on the substrate 110 is patterned to have substantially the same plane shape as a combined plane shape of the source electrode 133, the semiconductor 131, and the drain electrode 135, thereby being disposed under the source electrode 133, semiconductor 131, and drain electrode 135. Accordingly, a condition such as the plane area and the shape of the buffer layer 111 disposed under the semiconductor 131 may be uniform for the plurality of thin film transistors TR such that the amount of the impurity such as hydrogen (H) and/or oxygen (O) of the buffer layer 111 that is diffused and flows or permeates into the semiconductor 131 is substantially uniform. Accordingly, the deviation of the characteristics of the thin film transistor TR due to the impurity flowing into or penetrating the semiconductor 131, and the variation of the thin film transistor TR including the oxide semiconductor may be improved.

According to an exemplary embodiment of the present inventive concept, the upper surface of the source electrode 133 and the upper surface of the drain electrode 135 may have substantially the same height as the upper surface of the semiconductor 131. In addition, as shown in FIG. 1, the upper surface of the source electrode 133 and the upper surface of the drain electrode 135 may be slightly lower than the upper surface of the semiconductor 131. In the patterning process of the buffer layer 111, the source electrode 133 and the drain electrode 135 that are not covered by the gate insulator 141 may be exposed and slightly etched such that the thickness of the source electrode 133 and the drain electrode 135 in the third direction D3 may be less than a thickness of the semiconductor 131 in the third direction D3.

Further, the thin film transistor array panel according to an exemplary embodiment of the present inventive concept will be described with reference to FIG. 3 and FIG. 4 as well as FIG. 1 and FIG. 2.

Figure 3:
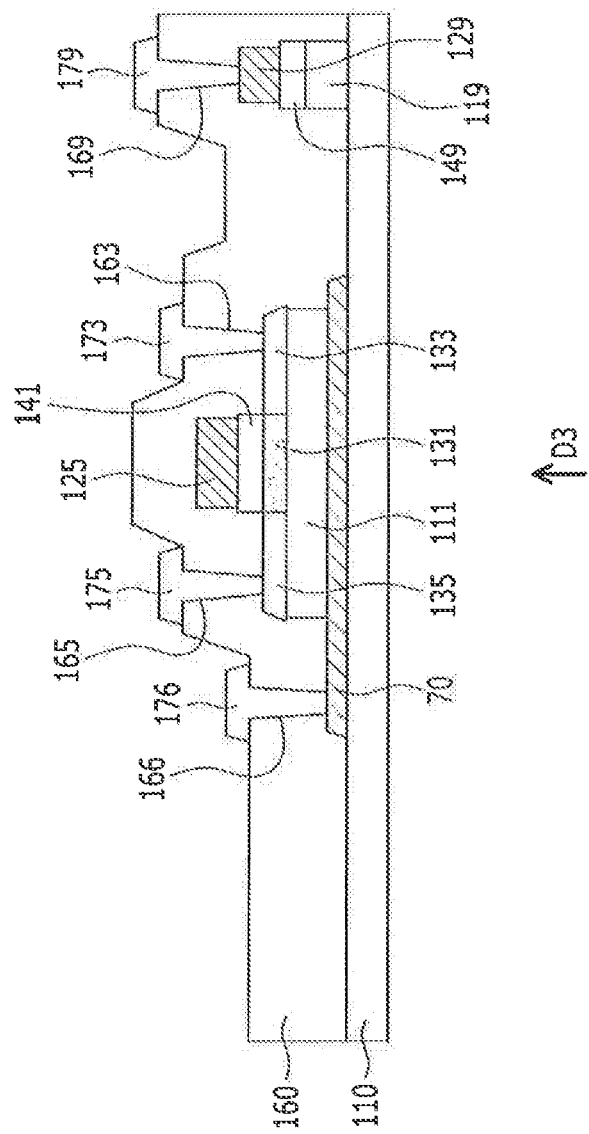
FIG. 3 and FIG. 4 are cross-sectional views of a thin film transistor array panel according to an exemplary embodiment of the present inventive concept.
Figure 4:
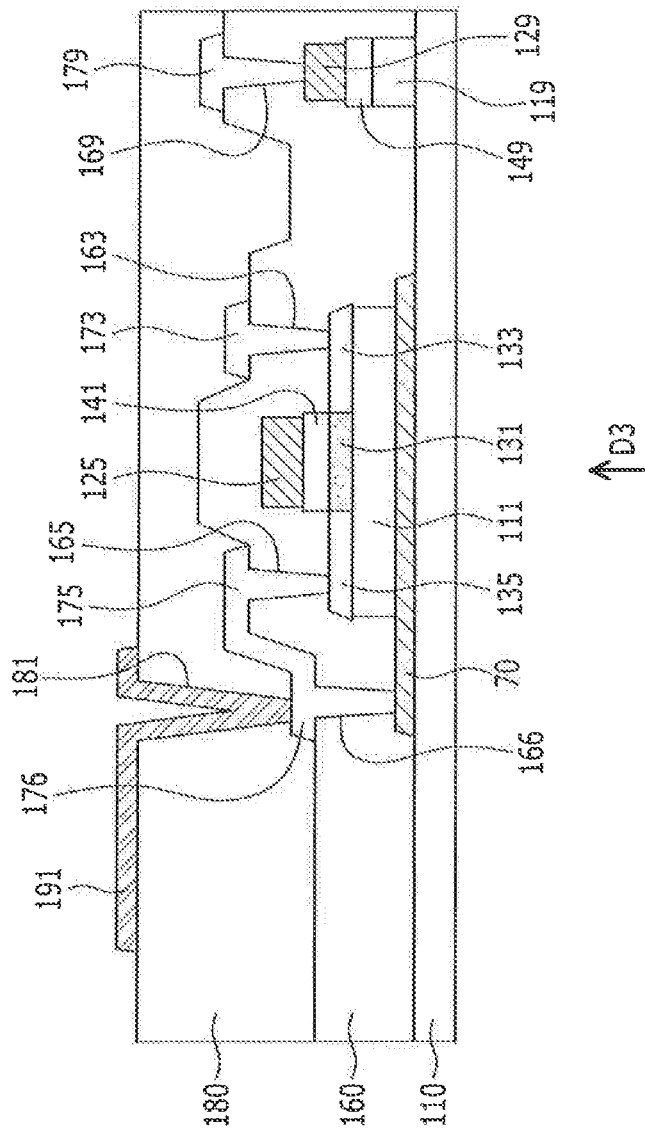

Referring to FIG. 3 and FIG. 4, the thin film transistor array panel according to an exemplary embodiment of the present inventive concept is similar to most of the above-described exemplary embodiments of the present inventive concept except for a light blocking film 70 disposed between the substrate 110 and the buffer layer 111 for the thin film transistor TR.

The light blocking film 70 may block external light from reaching the semiconductor 131, thereby preventing a characteristic deterioration of the semiconductor 131 and controlling a leakage of current from the thin film transistor TR. The light blocking film 70 may include a material that does not transmit the light of a wavelength band determined to be blocked, and for example, the light blocking film 70 may be made of the organic insulating material, the inorganic insulating material, or the conductive material such as the metal. In addition, the light blocking film 70 may be formed of the single layer or the multilayer structure. In an exemplary embodiment of the present inventive concept, the light blocking film 70 may include the conductive material.

The light blocking film 70 includes a portion that may overlap the buffer layer 111 in the third direction D3 and a portion that might not overlap the buffer layer. For example, the light blocking film 70 may be disposed below the buffer layer 111.

In the case of a thin film transistor TR, the light blocking film 70 may be omitted depending on several conditions such as a scenario where light is not irradiated under the substrate 110.

The interlayer insulating layer 160 may further include a contact hole 166 on the light blocking film 70, and the data conductor may further include a third connection part 176 electrically connected to the light blocking film 70 through the contact hole 166. For example, the contact hole 166 may penetrate the interlayer insulating layer 160 to the light blocking film and may expose a portion of the light blocking film 70. The third connection part 176 may be disposed on the same layer as the second connection part 175, and as shown in FIG. 4, the third connection part 176 may be connected to the second connection part 175. The light blocking film 70 may be applied with a voltage through the third connection part 176.

According to an exemplary embodiment of the present inventive concept, a height of the third connection part 176 extending from an upper surface of the interlayer insulating layer 160 to the upper surface of the light blocking film 70 is substantially the same as a height of the first connection part 173 or the second connection part 175 extending from the upper surface of the interlayer insulating layer 160 to the upper surface of the source electrode 133 or the drain electrode 135, respectively. The previously mentioned heights are substantially the same because the buffer layer 111 is only positioned under the source electrode 133, the semiconductor 131, and the drain electrode 135, and particularly, the buffer layer 111 is removed around the contact hole 166, which is different from a conventional art. Accordingly, a depth of the cross-sectional direction of the contact hole 166 on the light blocking film 70 is substantially the same as a depth of the cross-sectional direction of the contact holes 163 and 165 on the drain electrode 135 or the source electrode 133, respectively. Here, the depth means a depth in the third direction D3.

Accordingly, in the manufacturing process of the thin film transistor array panel, the kind, the number, and the depth of the layers that the different contact holes 163, 165 and 166 are penetrating to expose constituent elements (e.g., the source/drain electrodes 133 and 135 and the light blocking film 70), are substantially the same such that the contact holes 163, 165 and 166 may be simultaneously formed through a photolithography process using one photomask. Accordingly, the manufacturing process may be simplified and the entire process may be enhanced. Also, the number of photomasks that may be used in the manufacturing process may be reduced such that the manufacturing time and the manufacturing cost may be reduced. Also, it might not be necessary to use an etching gas having a high selectivity for the source electrode 133, the drain electrode 135, and the buffer layer 111. In addition, damage that the source electrode 133 and the drain electrode 135 or the semiconductor 131 may incur during the etching process for forming the contact hole may be reduced.

Referring to FIG. 3, a gate conductor 129 may be disposed on the same layer as the gate electrode 125 and may be made of substantially the same material as the gate electrode 125. Further, the gate conductor 129 may be disposed on the substrate 110. In addition, a gate insulator 149 and a buffer layer 119 having substantially the same plane shape as the gate conductor 129 may be disposed below the gate conductor 129. For example, the gate insulator 149 and the buffer layer 119 may be disposed on the substrate 110. In a plan view, an edge of the gate conductor 129 extending in a second direction D2, particularly an edge of a lower surface of the gate conductor 129, may be substantially parallel to an adjacent edge of the gate insulator 149, particularly an edge of an upper surface of the gate insulator 149. Further, an edge of the gate insulator 149 and an adjacent edge of the buffer layer 119 may be substantially aligned with one another. In an exemplary embodiment of the present inventive concept, a side surface of the buffer layer 119 that is substantially perpendicular to the substrate 110 along the second direction D2 may be substantially aligned with an adjacent side surface of the gate insulator 149 along the second direction D2. Further, the gate insulator 149 may be disposed at the same layer as the gate insulator 141 and may be formed of substantially the same material during the same process. In addition, the buffer layer 119 may be disposed at the same layer as the buffer layer 111 and may be formed of substantially the same material during the same process.

The interlayer insulating layer 160 may further include a contact hole 169 on the gate conductor 129. The contact hole 169 may be exposing a portion of the gate conductor 129. In addition, the data conductor may further include a fourth connection part 179 electrically connected to the gate conductor 129 through the contact hole 169.

Referring to FIG. 4, a passivation layer 180 may be disposed on the interlayer insulating layer 160 and the data conductor (e.g., first, second, third and fourth connection parts 173, 175, 176 and 179). The passivation layer 180 may include at least one of the inorganic insulating material and the organic insulating material, and the passivation layer 180 may be formed of the single layer or the multilayer structure. Further, an upper surface of the passivation layer 180 may be substantially flat.

The passivation layer 180 may include a contact hole 181 on the second connection part 175 or the third connection part 176. For example, the contact hole 181 penetrates the passivation layer 180 and exposes a portion of the third connection part 176. In addition, the third connection 176 may be electrically connected to the second connection part 175.

A pixel conductor including a pixel electrode 191 is disposed on the passivation layer 180. The pixel electrode 191 may be electrically connected to the second connection part 175 or the third connection part 176 through the contact hole 181. In this case, the second connection part 175 and the third connection part 176 may be electrically connected to one another. Accordingly, the pixel electrode 191 is electrically connected to the drain electrode 135 of the thin film transistor TR, thereby receiving the data voltage.

Referring to FIG. 4, the light blocking film 70 may be electrically connected to the pixel electrode 191 and the drain electrode 135 through the third connection part 176, thereby receiving the data voltage. As described, if the light blocking film 70 is electrically connected to the drain electrode 135 or the source electrode 133 of the thin film transistor TR to receive the voltage, a range of a change in current may be small in a saturation region of a voltage-current characteristic graph of the thin film transistor TR such that the characteristics of the current driving transistor may be improved.

Next, a manufacturing method of the thin film transistor according to an exemplary embodiment of the present inventive concept will be described with reference to FIG. 5 to FIG. 10 along with the above-described drawings. Here, the manufacturing method of the thin film transistor array panel described in FIG. 3 will be described.

Figure 5:
FIGS. 5, 6, 7, 8, 9 and 10 are cross-sectional views sequentially showing several steps of a manufacturing method of a thin film transistor array panel according to an exemplary embodiment of the present inventive concept.

Referring to FIG. 5, the organic insulating material, the inorganic insulating material, or the conductive material of the metal may be disposed on the substrate 110 including the insulating material such as glass or plastic. Further, the organic insulating material, the inorganic insulating material, or the conductive material of the metal may be patterned to form the light blocking film 70. In addition, according to an exemplary embodiment of the present inventive concept, to provide conductivity to the light blocking film 70, the conductive material may be deposited and patterned to form the light blocking film 70. The light blocking film 70 may be omitted depending on the kind of thin film transistor or the conditions of the thin film transistor array panel.

Figure 6:
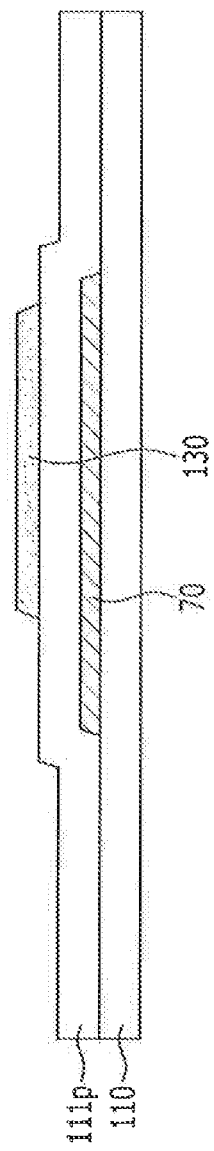

Referring to FIG. 6, the inorganic insulating material such as a silicon oxide (SiOx), a silicon nitride (SiNx), aluminum oxide ($Al_2O_3$), hafnium oxide ($HfO_3$), and yttrium oxide ($Y_2O_3$) may be disposed on the substrate 110 formed with the light blocking film 70 by a method such as a chemical vapor deposition to form a pre-buffer layer 111p.

The oxide semiconductor material such as zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO) may be disposed and patterned on the pre-buffer layer 111p to form a semiconductor layer 130.

Figure 7:
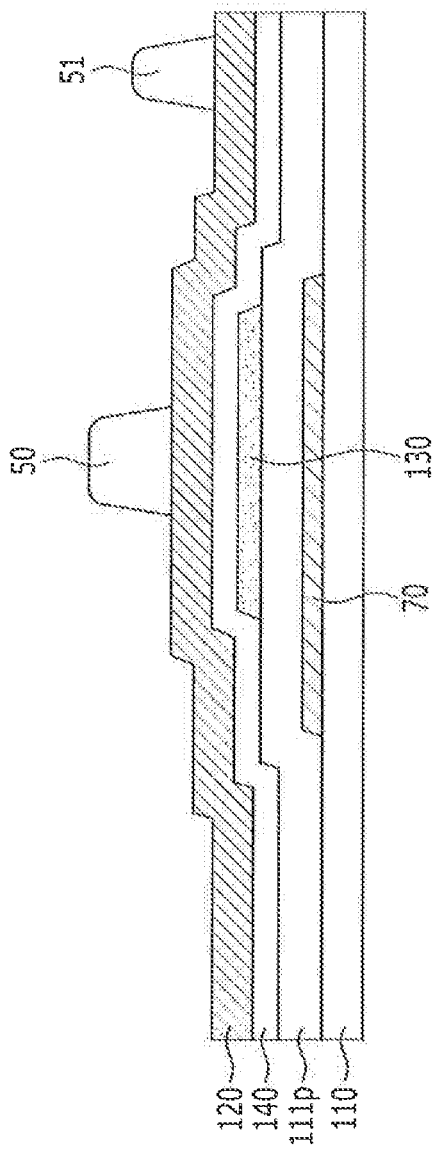

Referring to FIG. 7, the inorganic insulating material such as a silicon oxide (SiOx), a silicon nitride (SiNx), or a silicon oxynitride (SiON) may be disposed on the substrate 110 to form a gate insulating layer 140. In addition, the conductive material such as the metal may be disposed on the gate insulating layer 140 to form a gate conductive layer 120.

A photosensitive film such as a photoresist is coated on the gate conductive layer 120 and patterned through an exposure process using the photomask to form photosensitive film patterns 50 and 51.

Figure 8:
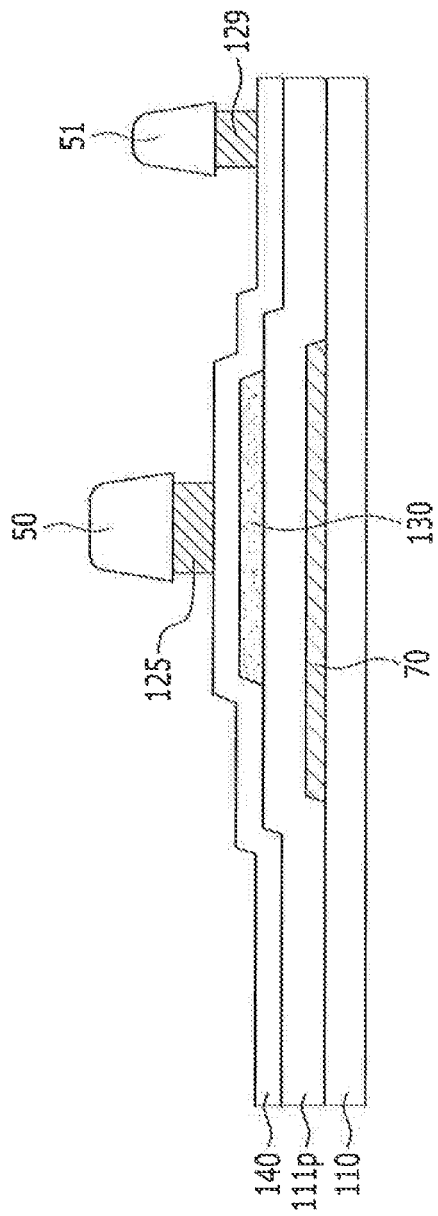

Referring to FIG. 8, the gate conductive layer 120 (e.g., as shown in FIG. 7) may be etched by using the photosensitive film patterns 50 and 51 as the mask to form the gate electrode 125 and the gate conductor 129. The gate conductive layer 120 may be etched by using, for example, wet etching or dry etching process.

Figure 9:
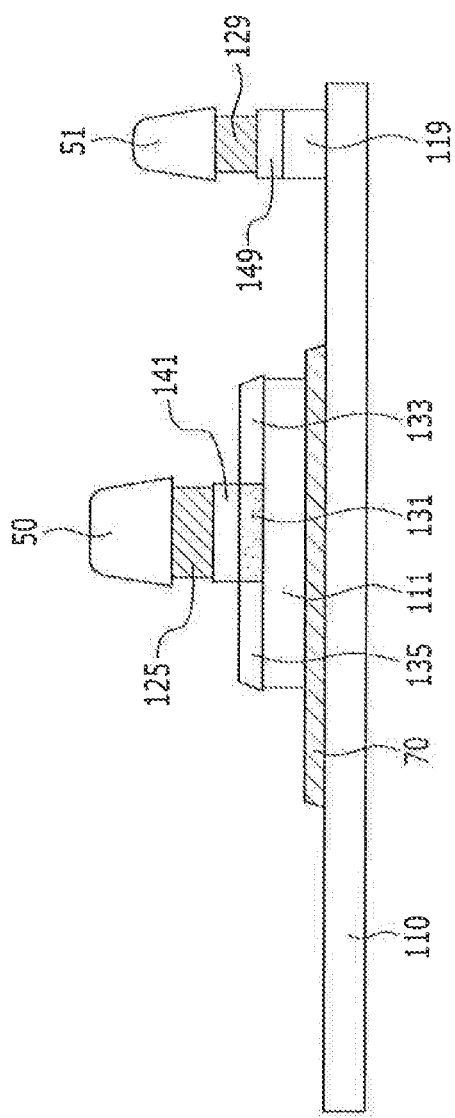

Referring to FIG. 9, the gate insulating layer 140 (e.g., as shown in FIG. 8) may be etched by using the photosensitive film patterns 50 and 51 as the mask to form the gate insulators 141 and 149. The gate insulating layer 140 may be etched by using, for example, the dry etching process. In this process, the component of the etching gas such as sulfur hexafluoride ($SF_6$) is doped into the semiconductor layer 130 (e.g., as shown in FIG. 8) that is not covered by the photosensitive film patterns 50 and 51 and the gate insulator 141, thereby reducing the resistance of the exposed part of the semiconductor layer 130. Accordingly, the part of the semiconductor layer 130 covered by the gate insulator 141 remains as the semiconductor 131. In addition, the remaining part of the semiconductor layer 130 that was not covered by the gate insulator 141 has conductivity, thereby forming the source electrode 133 and the drain electrode 135. However, exemplary embodiments of the present inventive concept are not limited thereto, and most of the semiconductor layer 130 may also maintain its semiconductor property in the patterning step to form the gate insulators 141 and 149.

In the etching process of the gate insulating layer 140 or after the etching process of the gate insulating layer 140, the pre-buffer layer 111p may be etched by using the semiconductor layer 130 as a mask to form the buffer layers 111 and 119. Most of the pre-buffer layer 111p disposed below the semiconductor layer 130 may remain by using the semiconductor layer 130 as the mask. Further, the pre-buffer layer 111p that is not covered by the semiconductor layer 130 is etched and removed. Accordingly, the upper surface of the light blocking film 70 and the substrate 110 that are not covered by the semiconductor layer 130 may be exposed.

The semiconductor layer 130 that is not covered by the gate insulator 141 and is exposed may be additionally processed to form the source electrode 133 and the drain electrode 135. In this case, the processing method may include a heat treatment method in a reduced atmosphere, or a plasma process method using a gas plasma such as hydrogen ($H_2$), helium (He), phosphine ($PH_3$), ammonia ($NH_3$), silane ($SiH_4$), methane ($CH_4$), acetylene ($C_2H_2$), diborane ($B_2H_6$), carbon dioxide ($CO_2$), germane ($GeH_4$), hydrogen selenide ($H_2Se$), hydrogen sulfide ($H_2S$), argon (Ar), nitrogen $N_2$, nitrous oxide ($N_2O$), or fluoroform ($CHF_3$). In addition, the semiconductor layer 130 covered by the gate insulator 141 maintains its semiconductor property, thereby being the semiconductor 131.

Figure 10:
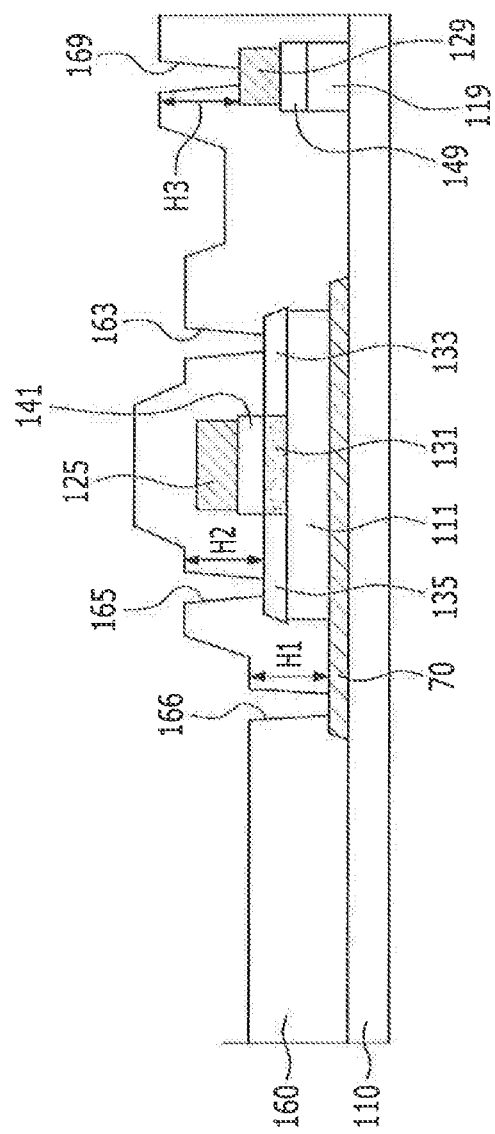

Referring to FIG. 10, the inorganic insulating material such as a silicon oxide (SiOx), a silicon nitride (SiNx), and a silicon oxynitride (SiON) may be disposed on the substrate 110 formed with the gate electrode 125 to form the interlayer insulating layer 160, which may be the single layer or the multilayer structure. In this case, the component such as hydrogen included in the gas, such as $SiH_4$ and $NH_3$, used in the layer formation process of the interlayer insulating layer 160 may be doped into the semiconductor layer 130, the source electrode 133 or the drain electrode 135, thereby forming the source electrode 133 or the drain electrode 135. After the layer formation of the interlayer insulating layer 160, the component such as hydrogen included in the interlayer insulating layer 160 is diffused into the source electrode 133 and the drain electrode 135, thereby reducing the resistance.

The interlayer insulating layer 160 may be patterned through the photolithography process using one photomask and the etching process to form the contact hole 166 exposing the light blocking film 70, the contact holes 163 and 165 respectively exposing the source electrode 133 and the drain electrode 135, and the contact hole 169 exposing the gate conductor 129. In this case, even the contact holes 166, 163, 165 and 169 exposing the constituent elements disposed at the different layers such as the light blocking film 70, the source and drain electrodes 133 and 135, and the gate conductor 129 for at least one thin film transistor TR are etched to penetrate the interlayer insulating layer 160 to substantially the same depth. Accordingly, the depths H1, H2, and H3 of the contact holes 166, 163, 165, and 169 extending in the third direction D3 are substantially the same. Thus, the time required for the etching may also be substantially the same.

Accordingly, the gas having the high etch selectivity might not be required in an etching step of the contact holes 166, 163, 165, and 169. In addition, the damage to the source electrode 133 and the drain electrode 135 may be reduced. Also, the plurality of contact holes 166, 163, 165, and 169 exposing the constituent elements disposed at different layers may be formed through one exposure process using one photomask such that the number of photomasks may be reduced, thereby reducing the process steps and the variation in the process.

Depending on the kind of thin film transistor, at least one of the contact hole 163 and the contact hole 165 might not be formed.

Referring to FIG. 3 as described above, the conductive material may be disposed and patterned on the interlayer insulating layer 160 to form the data conductor including the first connection part 173, the second connection part 175, the third connection part 176, and the fourth connection part 179. Depending on the kind of the thin film transistor, at least one of the first connection part 173 and the second connection part 175 might not be formed. Also, when omitting the light blocking film 70, the contact hole 166 and the third connection part 176 may be omitted.

Referring to FIG. 4 as described above, in an exemplary embodiment of the present inventive concept, a passivation layer 180 may be formed by disposing at least one of the inorganic insulating material and the organic insulating material on the data conductor (e.g., first, second, third and fourth connection parts 173,175,176 and 179). Further, a contact hole 181 exposing either the second connection part 175 or the third connection part 176 may be formed by patterning the passivation layer 180. For example, the passivation layer 180 may be patterned through a photolithography process using a photomask.

Figure 11:
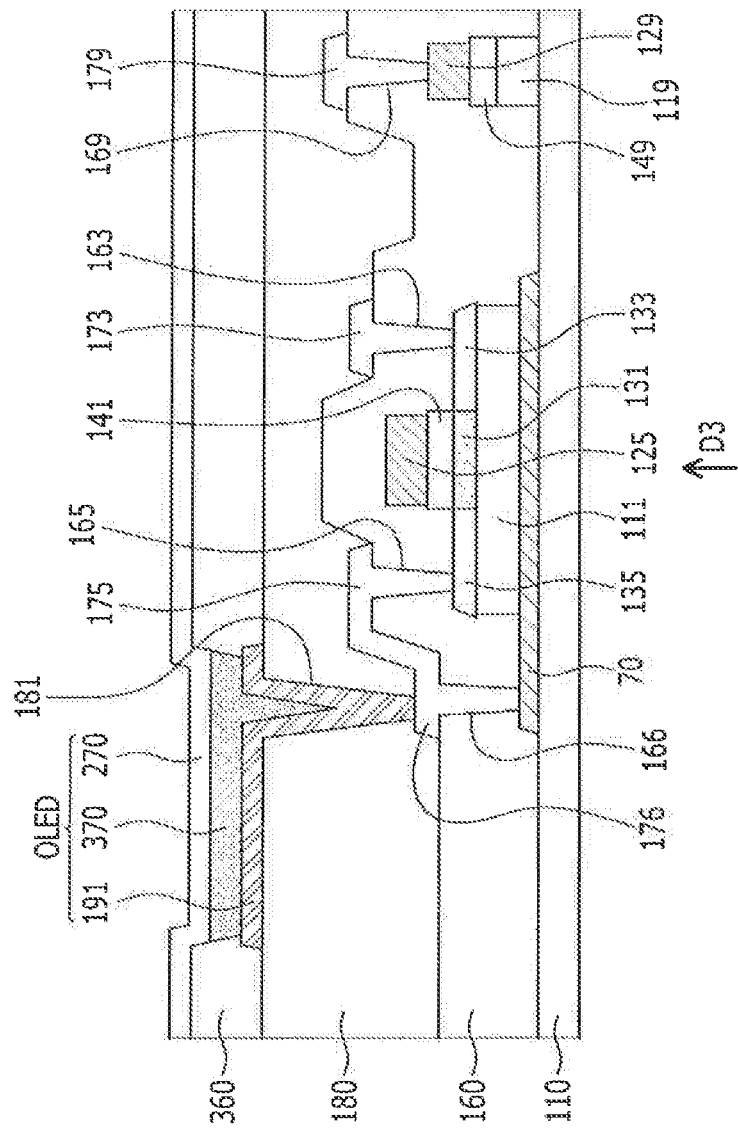
FIG. 11 is a cross-sectional view of a display device including a thin film transistor array panel according to an exemplary embodiment of the present inventive concept.

FIG. 11 shows a display device including the thin film transistor array panel according to an exemplary embodiment of the present inventive concept.

The display device according to an exemplary embodiment of the present inventive concept as an organic light emitting diode display may include the same constituent elements as the thin film transistor array panel according to the above-described exemplary embodiments of the present inventive concept. The same description for the above-described same constituent elements is omitted.

A pixel definition layer 360 may be formed on the passivation layer 180 and the pixel electrode 191. Further, the pixel definition layer 360 may be partially covering the pixel electrode 191. The pixel definition layer 360 includes an opening on the pixel electrode 191. The pixel definition layer 360 may be made of a resin such as a polyacrylate resin and a polyimide, a silica-based inorganic material, or the like.

An emission layer 370 may be disposed on the pixel electrode 191 in the opening of the pixel definition layer 360, and a common electrode 270 may be disposed on the emission layer 370. The pixel electrode 191, the emission layer 370, and the common electrode 270 together form an organic light emitting diode (OLED). The pixel electrode 191 forms an anode of the organic light emitting diode (OLED), and the common electrode 270 forms a cathode of the organic light emitting diode (OLED).

The light emitted from the emission layer 370 may be emitted from under the substrate 110 and travel directly through the substrate 110 or after several reflections, or may be emitted along the third direction D3 but not through the substrate 110. For example, in the organic light emitting diode (OLED) in which the light emitted from the emission layer 370 is emitted in the third direction D3, the light blocking film 70 may be omitted for all thin film transistors TR.

An encapsulation member, which may protect the organic light emitting diode (OLED) from contaminants or external elements, may be disposed on the common electrode 270.

Figure 12:
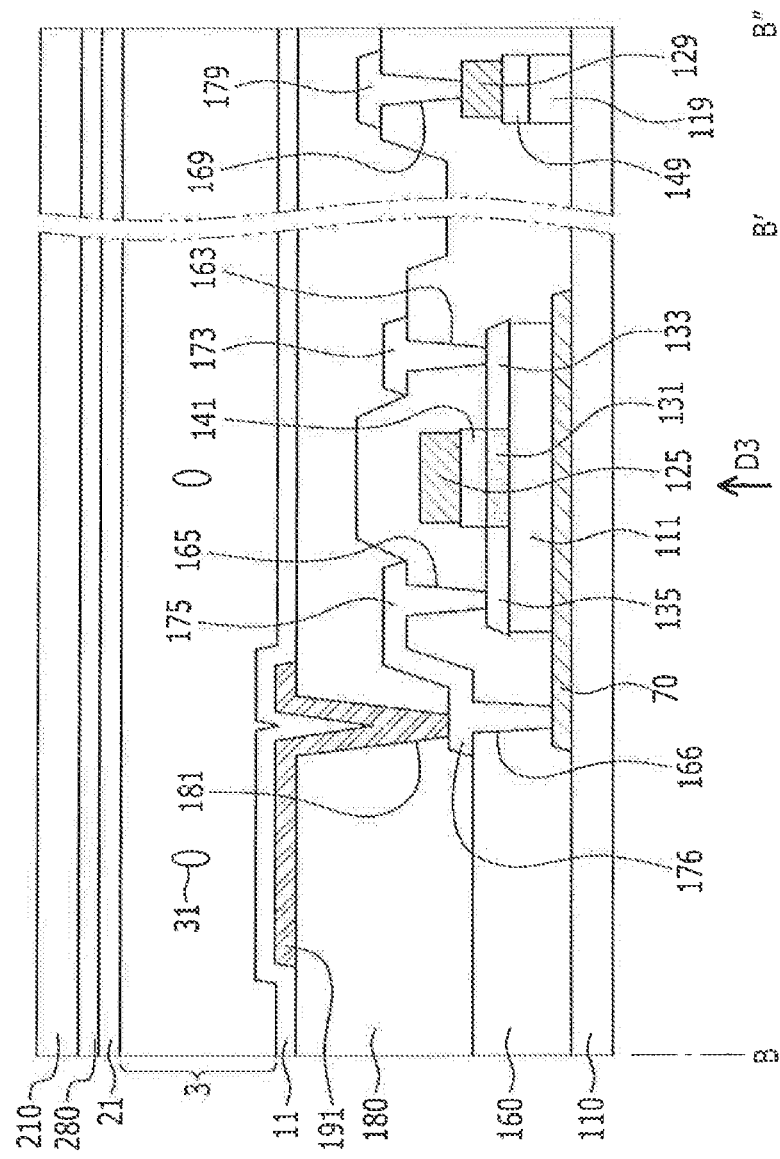
FIG. 12 is a cross-sectional view of a display device including a thin film transistor array panel according to an exemplary embodiment of the present inventive concept.
Figure 13:
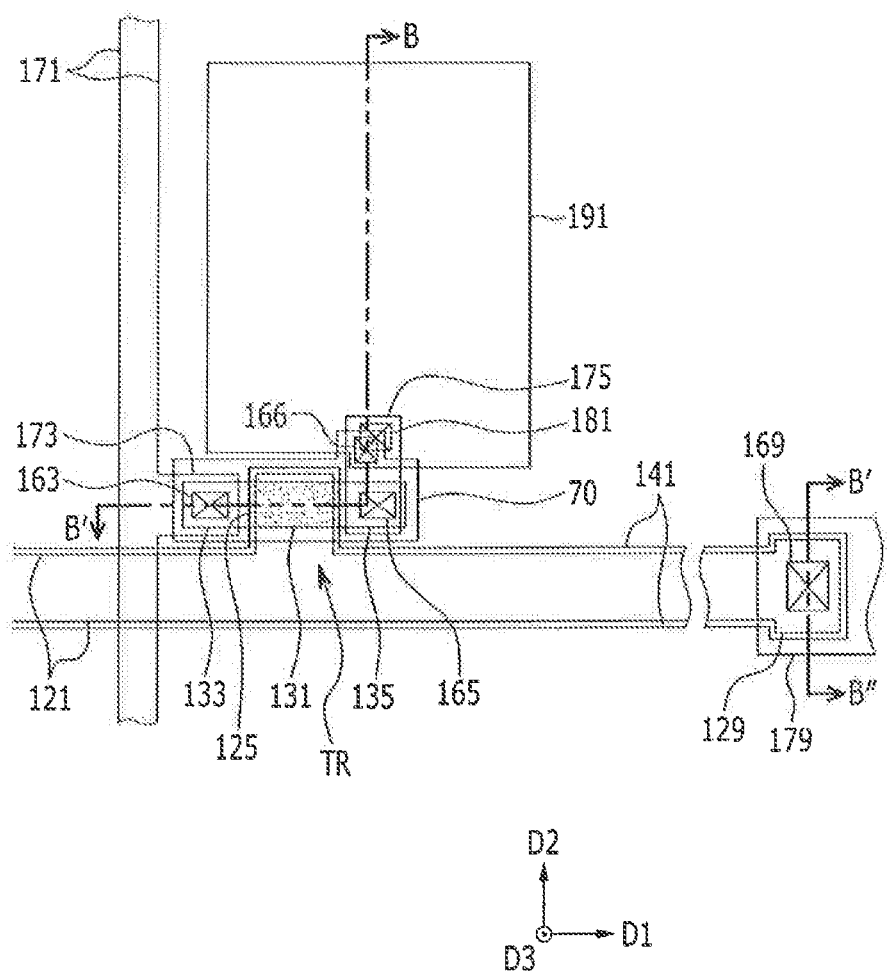
FIG. 13 is a plan view of the display device shown in FIG. 12 according to an exemplary embodiment of the present inventive concept.

FIG. 12 shows the display device including the thin film transistor array panel according to an exemplary embodiment of the present inventive concept, and FIG. 13 is a plan view corresponding to FIG. 12. FIG. 12 is a cross-sectional view of the thin film transistor array panel shown in FIG. 13 taken along a line B-B' and B'-B''; however, the plane structure of the thin film transistor array panel having the cross-sectional structure like FIG. 12 is not limited to the plane structure shown in FIG. 13.

The display device as a liquid crystal display according to an exemplary embodiment of the present inventive concept may include the same constituent elements as the thin film transistor array panel according to the above-described exemplary embodiments of the present inventive concept. The same description for the above-described same constituent elements is omitted.

A plurality of gate lines 121 connected to the gate electrode 125 may be disposed on the substrate 110. The gate line 121 may be disposed on the same layer as the gate electrode 125, and the gate line 121 may be formed of substantially the same material in the same process. The gate line 121 may extend in the first direction D1; however, it is not limited thereto.

The gate insulator 141 may be disposed under the gate electrode 125 and the gate line 121, and may include an edge extending, in a first direction D1, substantially parallel to an adjacent edge of the gate electrode 125 and the gate line 121 extending in the first direction D1. In this case, the gate insulator 141 may have substantially the same plane shape as the plane shape of the gate electrode 125 and a plane shape of the gate line 121.

Referring to FIG. 13, the gate electrode 125 may have a shape that protrudes upward or downward from the gate line 121 disposed on the substrate 110; however, exemplary embodiments of the present inventive concept are not limited thereto. In addition, the gate electrode 125 may be partially included in the gate line 121.

The above-described gate conductor 129 may correspond to an end of the gate line 121.

The data conductor (e.g., first, second, third and fourth connection parts 173, 175, 176 and 179) disposed on the interlayer insulating layer 160 may further include a data line 171 crossing the gate line 121. The data line 171 may be connected to the first connection part 173. The data line 171 may extend in the second direction D2. The first connection part 173 may have a shape that extends to the data line 171, which extends in either a positive second direction D2 or a negative second direction D2; however, exemplary embodiments of the present inventive concept are not limited thereto. In addition, the first connection part 173 may be partially included in the data line 171.

The pixel electrode 191 may include transparent conductive material such as indium tin oxide (ITO) and indium zinc oxide (IZO).

A liquid crystal layer 3 including a plurality of liquid crystals 31 may be disposed on the pixel electrode 191.

An insulating layer 210 sealing the liquid crystal layer 3 along with the substrate 110 may be disposed on the liquid crystal layer 3. The insulating layer 210 may have a shape similar to a shape of the substrate 110.

An opposed electrode 280 may control an arrangement direction of the liquid crystals 31 by generating an electric field to the liquid crystal layer 3 and the pixel electrode 191. The opposed electrode 280 may be disposed on or under the insulating layer 210. Alternatively, the opposed electrode 280 may be disposed between the substrate 110 and the liquid crystal layer 3. The opposed electrode 280 may include the transparent conductive material such as ITO and IZO.

Alignment layers 11 and 21 may be disposed between the liquid crystal layer 3 and the pixel electrode 191, and between the liquid crystal layer 3 and the insulating layer 210, respectively. The alignment layers 11 and 21 may control an initial alignment of the liquid crystal 31 when the electric field is not generated to the liquid crystal layer 3. The alignment layers 11 and 21 may be close to the liquid crystal layer 3.

The display device as a non-emissive display device according to an exemplary embodiment of the present inventive concept may further include a backlight supplying the light. The backlight may be disposed under the substrate 110.

Exemplary embodiments of the present inventive concept provide uniform characteristics to thin film transistors having the oxide semiconductor. Also, the present inventive concept resultantly enhances the quality of the thin film transistor array panel by reducing a number of photomasks used in a thin film transistor manufacturing process and by reducing a process variation.

The thin film transistor array panel according to an exemplary embodiment of the present inventive concept may be included in various display devices.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A method for manufacturing a thin film transistor array panel, the method comprising:
    forming a buffer layer by depositing a first insulating material on a substrate;
    forming a semiconductor layer by depositing and patterning an oxide semiconductor material on the buffer layer;
    forming a gate insulating layer by depositing a second insulating material on the substrate;
    forming a gate conductive layer by depositing a conductive material on the gate insulating layer;
    forming a photosensitive film pattern on the gate conductive layer by coating the gate conductive layer with a photoresist and patterning the photoresist through an exposure process using a mask;
    etching the gate conductive layer by using the photosensitive film pattern as a mask to form a gate electrode;
    etching the gate insulating layer by using the photosensitive film pattern as a mask to form a gate insulator;
    etching the buffer layer by using the semiconductor layer as a mask;
    forming a light blocking film on the substrate before forming the buffer layer, wherein a part of the light blocking film is exposed during the step of etching the buffer layer, and the light blocking film overlaps the semiconductor layer;
    forming an interlayer insulating layer by depositing a third insulating material on the substrate; and
    forming a first contact hole exposing the light blocking film by patterning the interlayer insulating layer through a photolithography process using one photomask.

2. The method of claim 1, wherein
    etching the buffer layer includes removing all sections of the buffer layer that are not covered by the semiconductor layer.

3. The method of claim 2, wherein the semiconductor layer extends beyond a first edge of the buffer layer and a second edge, opposite to the first edge, of the buffer layer.

4. The method of claim 2, further comprising
    forming a source electrode and a drain electrode from part of the semiconductor layer.

5. The method of claim 4, wherein the step of forming the source electrode and the drain electrode includes performing a plasma process on the semiconductor layer.

6. The method of claim 4, further comprising:
    forming a second contact hole exposing the drain electrode by patterning the interlayer insulating layer through the photolithography process using the one photomask.

7. The method of claim 5, wherein
    the interlayer insulating layer includes at least one among a silicon oxide (SiOx), silicon nitride (SiNx), and a silicon oxynitride (SiON).

8. The method of claim 5, wherein the step of forming the source electrode and the drain electrode is partially performed in at least one of the step of etching the gate insulating layer and the step of forming the interlayer insulating layer.

9. The method of claim 5, wherein a depth of the first contact hole is substantially the same as a depth of the second contact hole.

10. The method of claim 5, further comprising forming a first connection part electrically connected to the drain electrode through the second contact hole and by depositing and patterning a conductive material on the substrate after patterning the interlayer insulating layer; and
    forming a second connection part electrically connected to the light blocking film through the first contact hole by depositing and patterning the conductive material on the substrate after patterning the interlayer insulating layer,
    wherein the first connection part and the second connection part are connected to each other.

11. The method of claim 10, further comprising:
    forming a passivation layer on the substrate;
    forming a third contact hole exposing one of the first connection part and the second connection part by patterning the passivation layer; and
    forming a pixel electrode on the passivation layer, wherein the pixel electrode is electrically connected to one of the first connection part and the second connection part through the third contact hole.

* * * * *